United States Patent
Truong

(10) Patent No.: US 10,933,580 B2
(45) Date of Patent: Mar. 2, 2021

(54) CONTINUOUS LIQUID INTERFACE PRODUCTION WITH FORCE MONITORING AND FEEDBACK

(71) Applicant: Carbon, Inc., Redwood City, CA (US)

(72) Inventor: Ronald A. Truong, San Mateo, CA (US)

(73) Assignee: Carbon, Inc., Redwood City, CA (US)

( * ) Notice: Subject to any disclaimer, the term of this patent is extended or adjusted under 35 U.S.C. 154(b) by 0 days.

(21) Appl. No.: 16/466,517

(22) PCT Filed: Nov. 28, 2017

(86) PCT No.: PCT/US2017/063451
§ 371 (c)(1),
(2) Date: Jun. 4, 2019

(87) PCT Pub. No.: WO2018/111533
PCT Pub. Date: Jun. 21, 2018

(65) Prior Publication Data
US 2020/0180215 A1    Jun. 11, 2020

Related U.S. Application Data

(60) Provisional application No. 62/433,829, filed on Dec. 14, 2016.

(51) Int. Cl.
*B29C 64/135*    (2017.01)
*B29C 64/245*    (2017.01)
(Continued)

(52) U.S. Cl.
CPC .......... *B29C 64/135* (2017.08); *B29C 64/245* (2017.08); *B29C 64/277* (2017.08);
(Continued)

(58) Field of Classification Search
CPC .......................... G03F 7/70416; B29C 64/277
See application file for complete search history.

(56) References Cited

U.S. PATENT DOCUMENTS

| | | |
|---|---|---|
| 5,122,441 A | 6/1992 | Lawton et al. |
| 5,236,637 A | 8/1993 | Hull |

(Continued)

FOREIGN PATENT DOCUMENTS

| | | |
|---|---|---|
| EP | 2043845 | 10/2010 |
| WO | 2001/72501 | 10/2001 |

(Continued)

OTHER PUBLICATIONS

Product Brochure, W2P Professional Desktop 3D Printers, W2P Engineering GmbH, formnext, International exhibition conference on the next generation of manufacturing technologies, Frankfurt, Germany, Nov. 14-17, 2017, 8 pages.

(Continued)

*Primary Examiner* — Jacob T Minskey
*Assistant Examiner* — Virak Nguon
(74) *Attorney, Agent, or Firm* — Myers Bigel, P.A.

(57) ABSTRACT

A method of making a three-dimensional object (31) is carried out by: (a) providing a carrier (15) and an optically transparent member (12) having a build surface, the carrier (15) and the build surface defining a build region therebetween, the optically transparent member (12) carrying a polymerizable liquid (21); (b) advancing the carrier (15) and the optically transparent member (12) away from one another to draw the polymerizable liquid (21) into the build region; then (c) optionally, partially retracting the carrier (15) and the optically transparent member (12) back towards one another; and then (d) irradiating the build region with light to form a growing three-dimensional object (31) from the polymerizable liquid (21); and then (e) cyclically repeat- (Continued)

ing steps (b) to (d) while maintaining a continuous liquid interface (22) between the growing three-dimensional object (31) and the optically transparent member (12) until at least a portion of the three-dimensional object (31) is formed, while during at least some of the cyclically repeatings: (i) monitoring a transient increase in tension between the carrier (15) and the build surface through the growing three-dimensional object (31) during the advancing step (b), and optionally monitoring a transient increase in compression between the carrier (15) and the build surface through the growing three dimensional object during the partially retracting step (c); and then, when the transient increase in tension has substantially subsided, (ii) initiating the partially retracting step (c) when present, or initiating the irradiating step (d).

25 Claims, 10 Drawing Sheets

(51) Int. Cl.
| | |
|---|---|
| *B29C 64/393* | (2017.01) |
| *B29C 64/277* | (2017.01) |
| *G03F 7/20* | (2006.01) |
| *B33Y 10/00* | (2015.01) |
| *B33Y 30/00* | (2015.01) |
| *B29K 105/00* | (2006.01) |
| *B33Y 50/02* | (2015.01) |

(52) U.S. Cl.
CPC ........ *B29C 64/393* (2017.08); *G03F 7/70416* (2013.01); *B29K 2105/0002* (2013.01); *B29K 2105/0058* (2013.01); *B33Y 10/00* (2014.12); *B33Y 30/00* (2014.12); *B33Y 50/02* (2014.12)

(56) References Cited

U.S. PATENT DOCUMENTS

| | | | |
|---|---|---|---|
| 5,391,072 A | 2/1995 | Lawton et al. | |
| 7,438,846 B2 | 10/2008 | John | |
| 7,709,544 B2 | 5/2010 | Doyle et al. | |
| 7,845,930 B2 | 12/2010 | Shkolnik et al. | |
| 7,892,474 B2 | 2/2011 | Shkolnik et al. | |
| 8,110,135 B2 | 2/2012 | El-Siblani | |
| 8,845,316 B2 | 9/2014 | Schillen et al. | |
| 9,067,361 B2 | 6/2015 | El-Siblani | |
| 9,205,601 B2 | 12/2015 | Desimone et al. | |
| 9,211,678 B2 | 12/2015 | Desimone et al. | |
| 9,216,546 B2 | 12/2015 | Desimone et al. | |
| 9,360,757 B2 | 6/2016 | Desimone et al. | |
| 9,498,920 B2 | 11/2016 | Desimone et al. | |
| 9,993,974 B2 | 6/2018 | Desimone et al. | |
| 10,011,076 B2 | 7/2018 | El-Siblani et al. | |
| 10,016,938 B2 | 7/2018 | Desimone et al. | |
| 10,093,064 B2 | 10/2018 | Desimone et al. | |
| 10,144,181 B2 | 12/2018 | Desimone et al. | |
| 10,144,205 B2 | 12/2018 | El-Siblani | |
| 10,150,253 B2 | 12/2018 | Desimone et al. | |
| 10,220,565 B2 | 3/2019 | El-Siblani | |
| 10,300,663 B2 | 5/2019 | El-Siblani et al. | |
| 10,596,755 B2 | 3/2020 | Desimone et al. | |
| 10,618,215 B2 | 4/2020 | Desimone et al. | |
| 2009/0289384 A1* | 11/2009 | Maalderink | B29C 64/135 264/40.1 |
| 2011/0089610 A1 | 4/2011 | El-Siblani et al. | |
| 2013/0292862 A1 | 11/2013 | Joyce | |
| 2013/0295212 A1* | 11/2013 | Chen | B29C 64/129 425/150 |
| 2015/0331402 A1* | 11/2015 | Lin | B33Y 50/02 700/119 |
| 2015/0360419 A1 | 12/2015 | Willis et al. | |
| 2017/0129167 A1 | 5/2017 | Castanon | |
| 2017/0129169 A1 | 5/2017 | Batchelder et al. | |
| 2019/0016050 A1* | 1/2019 | Stadlmann | B33Y 30/00 |
| 2019/0111622 A1* | 4/2019 | Khalip | B29C 64/268 |
| 2019/0126547 A1 | 5/2019 | Desimone et al. | |
| 2019/0160733 A1* | 5/2019 | Mirkin | B29C 64/245 |
| 2019/0322033 A1* | 10/2019 | Willis | B29C 64/124 |
| 2019/0389127 A1 | 12/2019 | Desimone et al. | |
| 2020/0139617 A1 | 5/2020 | Desimone et al. | |

FOREIGN PATENT DOCUMENTS

| | | | |
|---|---|---|---|
| WO | 2011/086450 | 7/2011 | |
| WO | 20160140891 | 9/2016 | |
| WO | WO-2016140891 A1 * | 9/2016 | ........... B29C 64/393 |

OTHER PUBLICATIONS

Dental catalogue, SHERAdigital, 2017, 82 pages.
International Preliminary Report on Patentability for PCT/US2017/063451, dated Jun. 27, 2019, 8 pages.
Dendurkuri et al., Continuous-flow lithography for high-throughput microparticle synthesis, Nature Materials, vol. 5, pp. 365-369, May 2006, published online Apr. 9, 2006.
Dendurkuri et al., Modeling of Oxygen-Inhibited Free Radical Photopolymerization in PDMS Microfluidic Device, Macromolecules, 2008, 41 (22), 8547-8556, published Oct. 21, 2008.
Yasuda et al., Permeability of Polymer Membranes to Dissolved Oxygen, pp. 1314-1316 (1966) Journal of Polymer Science, vol. 4.
Stern, S.A., The 'Barrer' Permeability Unit, pp. 1933-1934 (1968) Journal of Polymer Science, Part A-2, vol. 6.
Morelli, Dean. Protest to Canadian Patent Applications by Joseph DeSimone et al. Regarding Continuous Liquid Interphase Printing. Canadian patent applications CA2898098A1, CA 2898103A1, and CA2898106A1. Dec. 31, 2015. Canadian Intellectual Property Office, 37 pp.
Y. Pan et al., J. Manufacturing Sci. and Eng. 134, 051011-1 (Oct. 2012).
J. Tumbleston et al., Continuous liquid interface production of 3d objects, Science 347, 1349-1352 (published online Mar. 16, 2015).
Dendukuri et al., Stop-flow lithography in a microfluidic device, Lab Chip, 2007, 7, 818-828, published online May 21, 2007.
International Search Report and Written Opinion for PCT/US2017/063451 dated Feb. 26, 2018, 12 pages.

\* cited by examiner

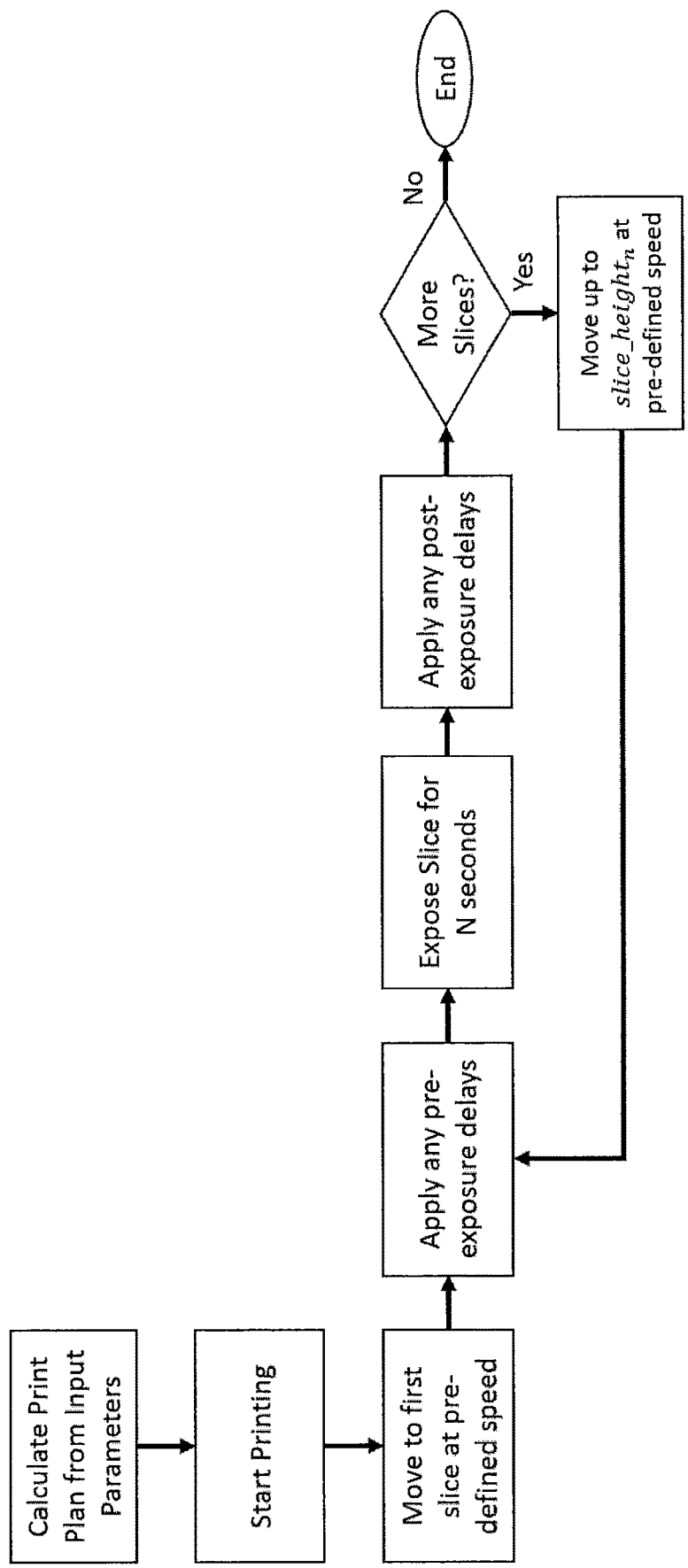
FIGURE 4: Stepped Mode *Without* Feedback.

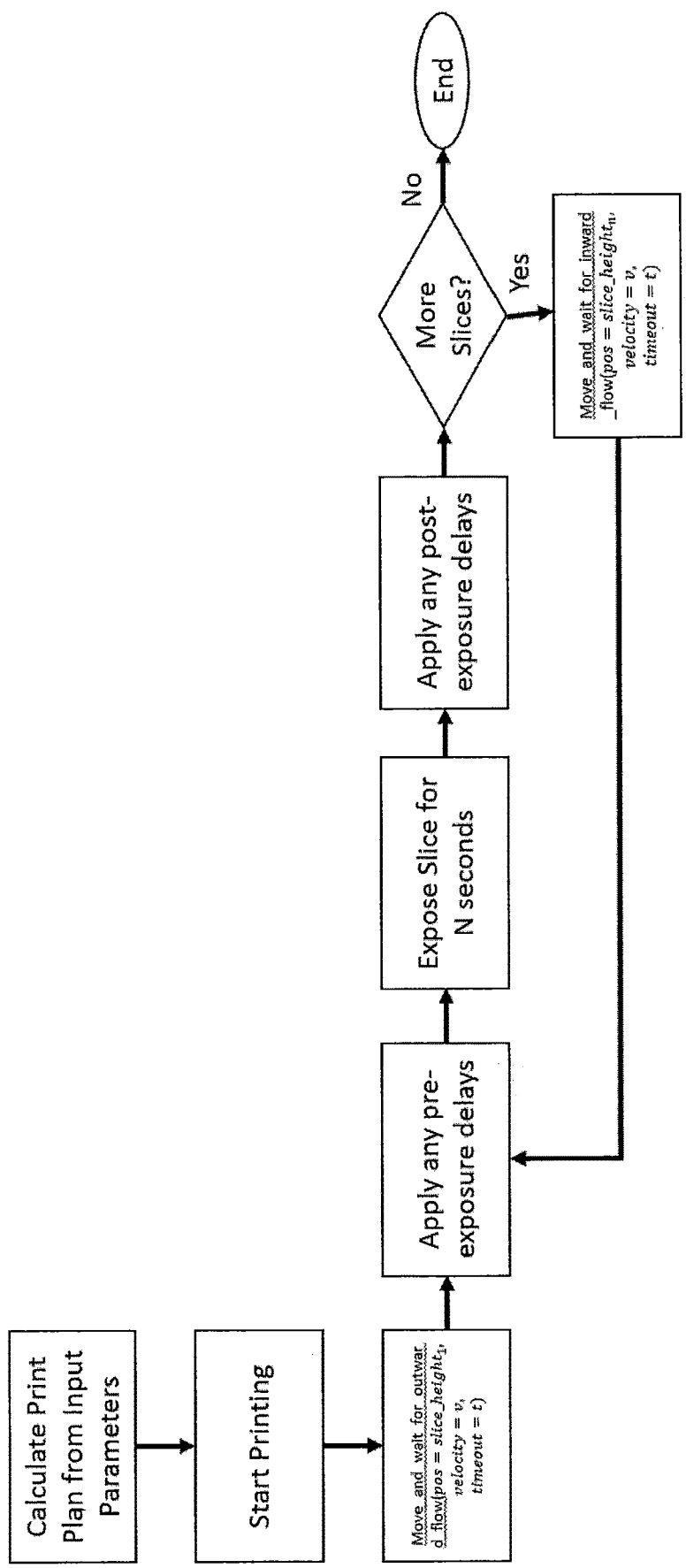
FIGURE 5: Stepped Mode *With* Feedback.

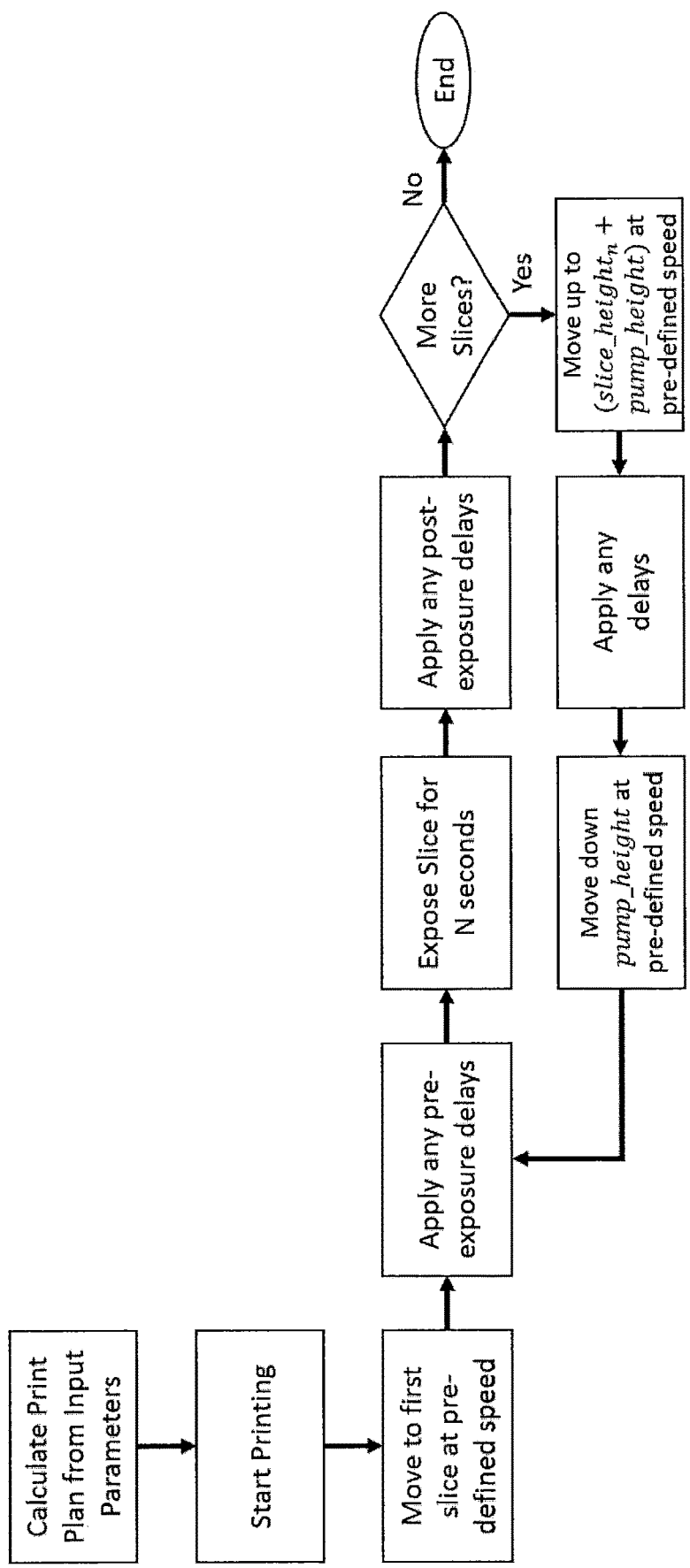
FIGURE 6: Reciprocal Mode *Without* Feedback.

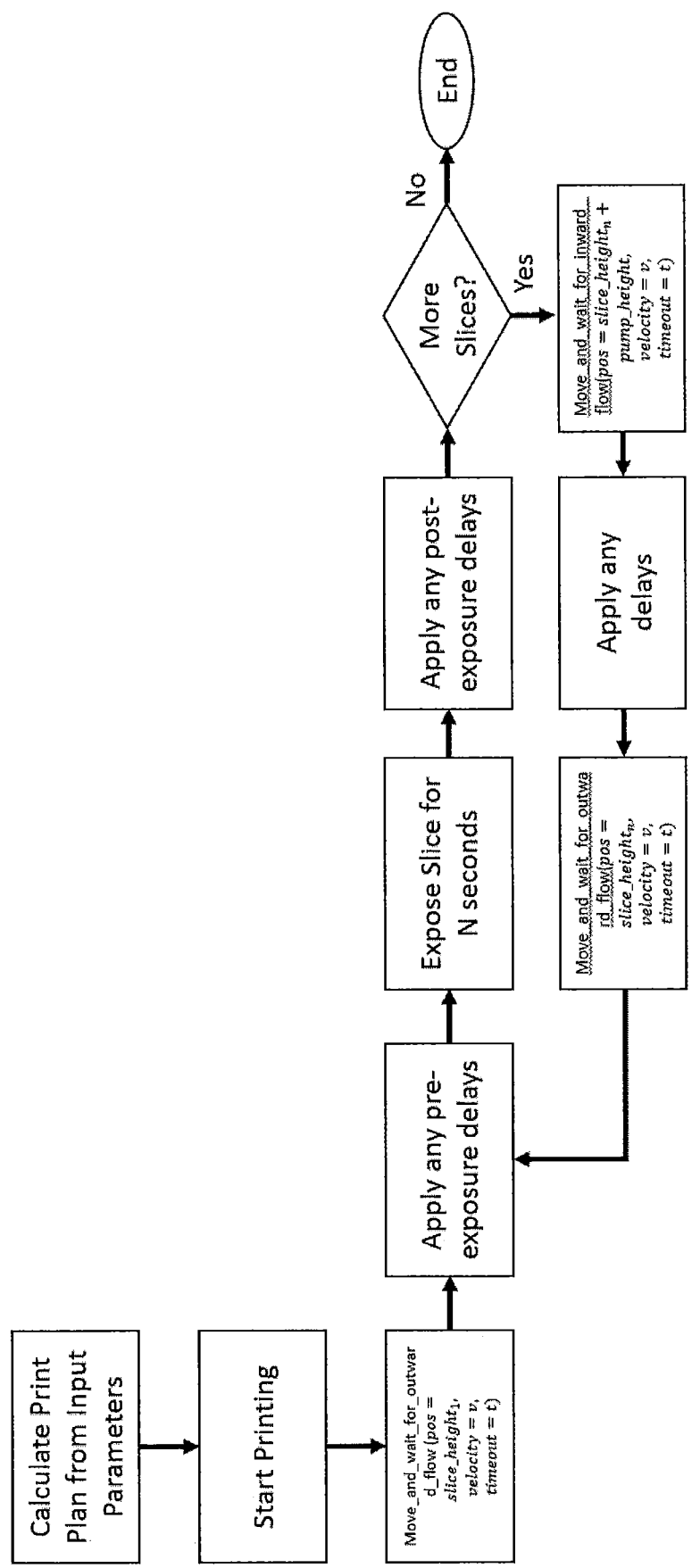
FIGURE 7: Reciprocal Mode *With* Feedback.

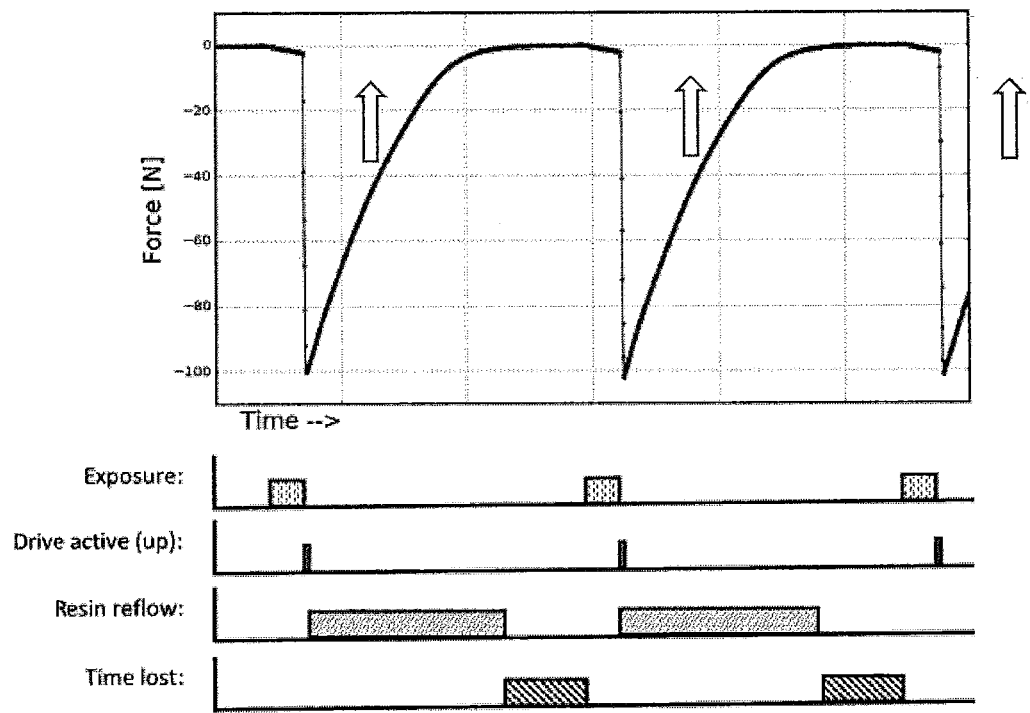
**FIGURE 8: Stepped Mode *Without* Feedback.**
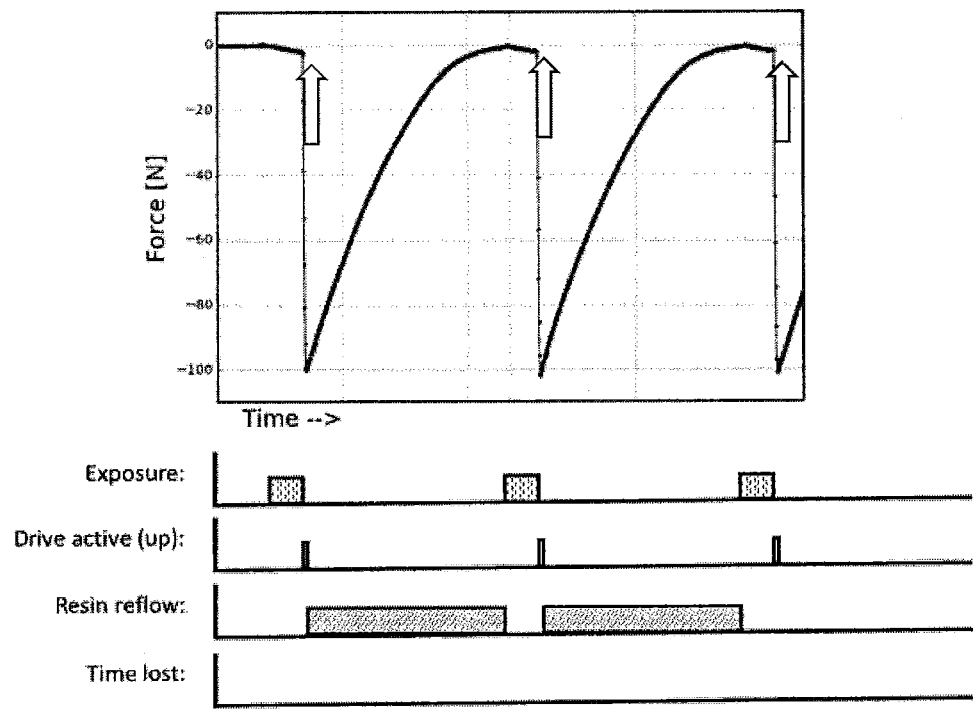
**FIGURE 9: Stepped Mode *With* Feedback.**

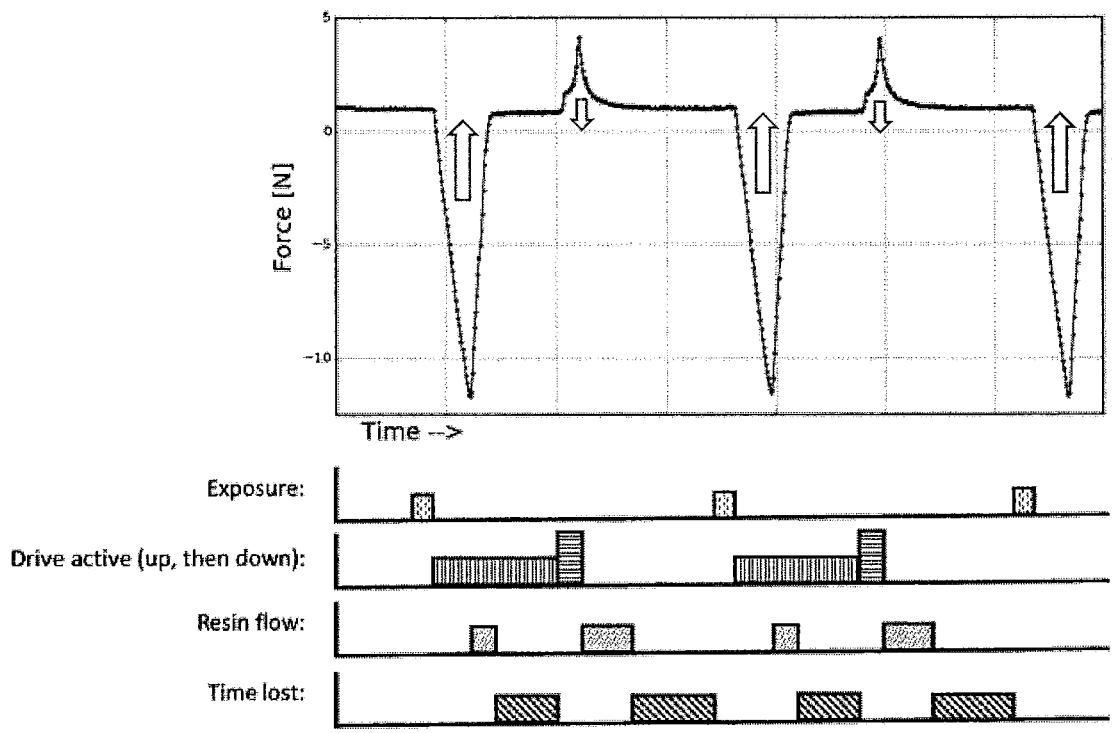
**FIGURE 10: Reciprocal Mode *Without* Feedback.**
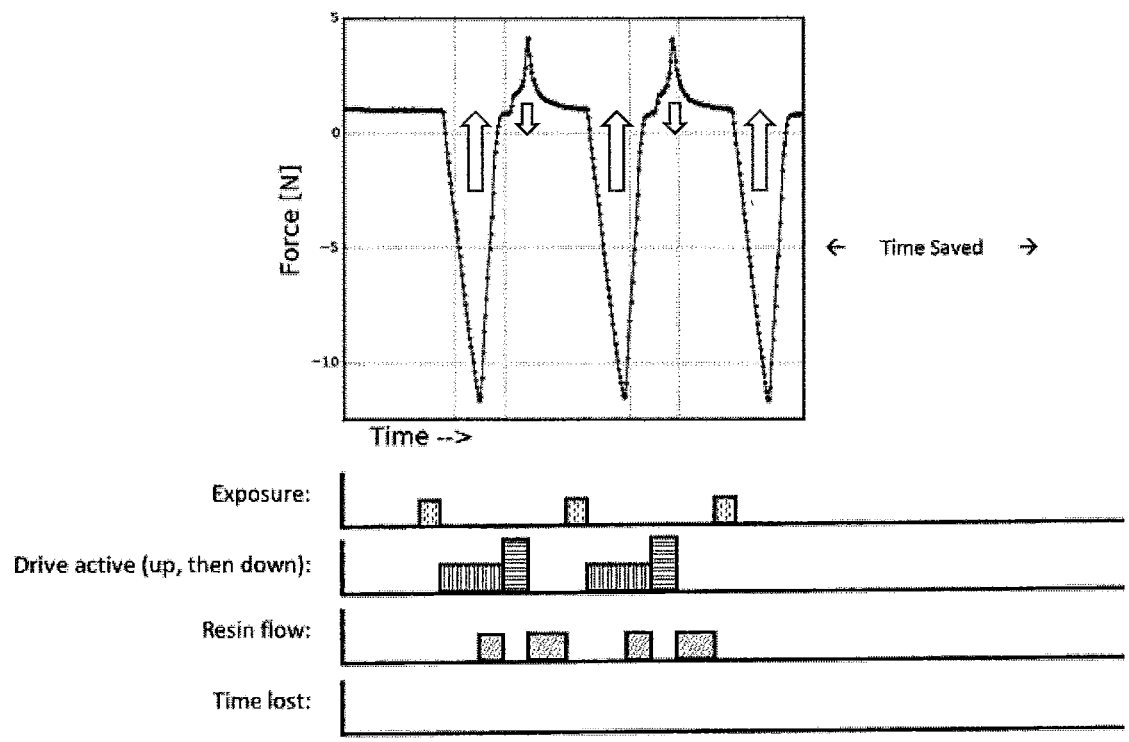
**FIGURE 11: Reciprocal Mode *With* Feedback.**

CONTINUOUS LIQUID INTERFACE PRODUCTION WITH FORCE MONITORING AND FEEDBACK

RELATED APPLICATIONS

This application is a 35 U.S.C. § 371 national phase entry of International Application No. PCT/US2017/063451, filed Nov. 28, 2017, which claims the benefit of U.S. provisional patent application Ser. No. 62/433,829, filed Dec. 14, 2016, the disclosure disclosures of which are incorporated by reference herein in its entirety their entireties.

FIELD OF THE INVENTION

The present invention concerns stereolithography methods and apparatus, particularly those for carrying out continuous liquid interface production.

BACKGROUND OF THE INVENTION

J. DeSimone et al., *Continuous Liquid Interphase Printing*, PCT Application No. WO2014/1268372 (published Aug. 21, 2014; see also U.S. Pat. No. 9,205,601) describes an improved stereolithography method from a window in which adhesion to the window is inhibited by allowing an inhibitor of polymerization, such as oxygen or a base, to pass through the window (or out of a "pool" within the window), forming a non-polymerized release layer or "dead zone" that forms a "liquid interface" with the growing three-dimensional object, in turn enabling continuous or layerless production of the three-dimensional object from that interface (see also J. Tumbleston et al., Continuous liquid interface production of 3D Objects, *Science* 347, 1349-1352 (published online 16 Mar. 2015)). Other approaches for carrying out continuous liquid interface production (or "CLIP") include utilizing a liquid interface comprising an immiscible liquid (see L. Robeson et al., WO 2015/164234, published Oct. 29, 2015), generating oxygen as an inhibitor by electrolysis (see I. Craven et al., WO 2016/133759, published Aug. 25, 2016), and incorporating magnetically positionable particles to which the photoactivator is coupled into the polymerizable liquid (see J. Rolland, WO 2016/145182, published Sep. 15, 2016). Ermoshkin et al., *Three-Dimensional Printing with Reciprocal Feeding of Polymerizable Liquid*, PCT Application Publication No. WO 2015/195924 (published Dec. 23, 2015), describes CLIP processes in which the carrier is advanced in a step-wise fashion, or in a reciprocal fashion, to facilitate the flow of viscous polymerizable liquid into the build region (see particularly FIGS. 22-25, and 27A-29B, and associated text, therein)

One advantage of CLIP is the speed by which objects can be made. Another advantage of CLIP is the diversity of (generally viscous) polymerizable liquids which can be used in the process, such as the "dual cure" resins described in J. Rolland et al., U.S. Pat. No. 9,453,142 (and others). However, in some cases the intermediate three-dimensional objects formed by such resins are—due to the inherent flexibility of the material—themselves flexible rather than stiff. In other cases—due to the geometry of the object—the intermediate may be relatively stiff during early production of the object, but as production progress the object may, overall, become increasingly flexible (or "compliant"). In cases like these, the compliant object being produced may be unable to overcome fluid adhesion of the object to the build surface and allow fluid flow into the build region (particularly during step-wise or reciprocal modes of operation).

An additional potential complication in speeding up production is premature light activation. If light exposure is activated prematurely in stepped modes, while resin is still flowing into the build region, uncured internal resin channels in the object (observable as surface pitting on the object) can occur. And if light exposure is activated prematurely in reciprocal modes, while resin is flowing out of the build region, blooming or fuzzing of the object surface (sometimes referred to as "fringing") can occur. Accordingly, there is a need for new ways to implement continuous liquid interface production.

SUMMARY OF THE INVENTION

A first aspect of the invention is a method of making a three-dimensional object, which is carried out by: (a) providing a carrier and an optically transparent member having a build surface, the carrier and the build surface defining a build region therebetween, the optically transparent member carrying a polymerizable liquid; (b) advancing the carrier and the optically transparent member away from one another to draw the polymerizable liquid into the build region; then (c) optionally, partially retracting the carrier and the optically transparent member back towards one another; and then (d) irradiating the build region with light to form a growing three-dimensional object from the polymerizable liquid; and then (e) cyclically repeating steps (b) to (d) while maintaining a continuous liquid interface between the growing three-dimensional object and the optically transparent member until at least a portion of the three-dimensional object is formed, while during at least some of the cyclically repeatings: (i) monitoring a transient increase in tension between the carrier and the build surface through the growing three-dimensional object during the advancing step (b), and optionally monitoring a transient increase in compression between the carrier and the build surface through the growing three dimensional object during the partially retracting step (c); and then, when the transient increase in tension has substantially subsided, (ii) initiating the partially retracting step (c) when present, or initiating the irradiating step (d). In some embodiments, during at least some of the cyclically repeatings, the partially retracting step (c) is absent; in other embodiments, during at least some of the cyclically repeatings, the partially retracting step (c) is present. In some embodiments, the method further includes, during at least some of the cyclically repeatings: (iii) monitoring a transient increase in compression between the carrier and the build surface through the growing three dimensional object during the partially retracting step (c); and then, when the transient increase in compression has substantially subsided, (iv) initiating the irradiating step (d).

A further aspect of the invention is a method of making a three-dimensional object, which is carried out by: (a) providing a carrier and an optically transparent member having a build surface, the carrier and the build surface defining a build region therebetween, the optically transparent member carrying a polymerizable liquid; (b) advancing the carrier and the optically transparent member away from one another to draw the polymerizable liquid into the build region; then (c) partially retracting the carrier and the optically transparent member back towards one another; and then (d) irradiating the build region with light to form a growing three-dimensional object from the polymerizable liquid; and then (e) cyclically repeating steps (b) to (d) while maintaining a continuous liquid interface between the growing three-dimensional object and the optically transparent member until at least a portion of the three-dimensional object is formed, while during at least some of the cyclically repeatings: (i) optionally, monitoring a transient increase in tension between the carrier and the build surface through the growing three-dimensional object during the advancing step (b), and optionally monitoring a transient increase in compression between the carrier and the build surface through the growing three dimensional object during the partially retracting step (c); and then, when the transient increase in tension has substantially subsided, (ii) optionally, initiating the partially retracting step (c) when present, or initiating the irradiating step (d); then (iii) monitoring a transient increase in compression between the carrier and the build surface through the growing three dimensional object during the partially retracting step (c); and then, when the transient increase in compression has substantially subsided, (iv) initiating the irradiating step (d).

In some embodiments of the foregoing, at least a portion of the three-dimensional object is formed while (f) continuously advancing the carrier and the optically transparent member away from one another and (g) intermittently or continuously irradiating the build region to form the growing three-dimensional object, while maintaining the continuous liquid interface.

In some embodiments of the foregoing, at least a portion of the growing three-dimensional object is flexible (due to flexibility of the solidified material, the geometry of the object, or a combination thereof).

In some embodiments of the foregoing, at least a portion (e.g., a major portion) of the object is in the form of a lattice or mesh.

In some embodiments of the foregoing, the polymerizable liquid is viscous at room temperature (e.g., 25 degrees Centigrade) (e.g., has a viscosity of at least 200, 300, 1,000, or 2,000 Centipoise, or more, at room temperature).

In some embodiments of the foregoing, the optically transparent member comprises a semipermeable member (e.g., a fluoropolymer), the advancing, partially retracting when present, irradiating, and/or cyclically repeating steps are carried out while also concurrently:

(i) continuously maintaining a dead zone of polymerizable liquid in contact with the build surface, and/or
(ii) continuously maintaining a gradient of polymerization zone between the dead zone and the growing three dimensional object and in contact with each thereof, the gradient of polymerization zone comprising the polymerizable liquid in partially cured form, and the continuously maintaining a dead zone is carried out by feeding an inhibitor of polymerization through the optically transparent member, thereby creating a gradient of inhibitor in the dead zone and optionally in at least a portion of the gradient of polymerization zone. For example, in some embodiments, the polymerizable component comprises a free radical polymerizable liquid and the inhibitor comprises oxygen; in other embodiments, the polymerizable component comprises an acid-catalyzed or cationically polymerizable liquid, and the inhibitor comprises a base.

In some embodiments of the foregoing, the three-dimensional object is fabricated at a speed of at least 1 or 10 millimeters per hour, to 1,000 or 10,000 millimeters per hour, or more.

A further aspect of the invention is an apparatus useful for making a three-dimensional object from a polymerizable liquid, which apparatus includes: (a) a carrier on which a three-dimensional object can be made; (b) an optically transparent member having a build surface operatively associated with the carrier, the carrier and the build surface defining a build region therebetween, the optically transparent member configured for carrying a polymerizable liquid; (c) an elevator assembly operatively associated with the carrier and/or the optically transparent member, the elevator assembly configured for advancing the carrier and the optically transparent member away from one another to draw the polymerizable liquid into the build region; (d) a light engine operatively associated with the optically transparent member and positioned to irradiate the build region with light to form a growing three-dimensional object from the polymerizable liquid; (e) a force sensor operatively associated with the carrier and/or the optically transparent member and configured to monitor a transient increase in tension and/or a transient increase in compression between the carrier and the build surface through a three-dimensional object being formed therebetween; and (f) a controller operatively associated with the elevator assembly, the light engine, and the force sensor, with the controller configured for cyclically repeating cycles of advancing the carrier and the build surface away from one another, then optionally partially retracting the carrier and build surface back towards one another, and then and irradiating the build region with light, to form a three-dimensional object therebetween while maintaining a continuous liquid interface between the three-dimensional object and the optically transparent member until at least a portion of the three-dimensional object is formed, the controller further configured to, during at least some of the cyclically repeatings: (i) monitor a transient increase in tension between the carrier and the build surface through the growing three-dimensional object during the advancing, optionally monitor a transient increase in compression between the carrier and the build surface through the growing three dimensional object during the partially retracting, and then, when the transient increase in tension has substantially subsided, initiate the partially retracting when present, or initiating the irradiating; and/or (ii) monitor a transient increase in compression between the carrier and the build surface through the growing three dimensional object during the partially retracting, and then, when the transient increase in compression has substantially subsided, initiate the irradiating step. In some embodiments, the optically transparent member comprises a semipermeable member (e.g., a fluoropolymer). In some embodiments, the light engine comprises a light source (e.g., a laser) in combination with a patterning array (e.g., a liquid crystal display array or a digital micromirror array). In some embodiments, the force sensor comprises a strain gauge.

The step of monitoring a transient increase in tension can be carried out by: (a) monitoring absolute force, (b) monitoring rate of change of force, or (c) monitoring both absolute force and rate of change of force in combination with one another. In some embodiments, (b) or (c) are preferred, to reduce the influence of slow drift of zero, as discussed below.

Lin et al./Autodesk Inc., US Patent Application Publication No. 2015/0331402 (Nov. 19, 2015) describes strain gauges embedded in a DLP SLA system at paragraphs 0032-0033 for determining window adhesion, and for measuring compressive, tensile, shear, bending, and torsional stresses during printing, but does not suggest their use in association with either the fabrication of an elastic intermediate or during stepped or reciprocal print modes, and does not indicate how such information might be use to obviate time lost in the course of such modes.

The present invention is explained in greater detail in the drawings herein and the specification set forth below. The disclosures of all United States patent references cited herein are to be incorporated herein by reference in their entirety.

BRIEF DESCRIPTION OF THE DRAWINGS

FIG. 4 illustrates stepped control elements of one embodiment of an apparatus of the invention, but without force feedback implemented.

FIG. 5 illustrates stepped control elements of the embodiment of FIG. 4, but with force feedback now implemented.

FIG. 6 illustrates reciprocal control elements of one embodiment of an apparatus of the invention, but without force feedback implemented.

FIG. 7 illustrates reciprocal control elements of the embodiment of FIG. 6, but with force feedback now implemented.

FIG. 8 illustrates the forces sensed in a stepped mode of operation of continuous liquid interface production (CLIP), with force monitoring, but without feedback.

FIG. 9 illustrates the stepped mode of operation of CLIP of FIG. 8, but with force feedback implemented to reduce time otherwise lost.

FIG. 10 illustrates the forces sensed in a reciprocal mode of operation of CLIP, with force monitoring, but without feedback.

FIG. 11 illustrates the reciprocal mode of operation of CLIP of FIG. 10, but with force feedback implemented (for both tension and compression), to reduce time otherwise lost.

DETAILED DESCRIPTION OF ILLUSTRATIVE EMBODIMENTS

Figure 1:
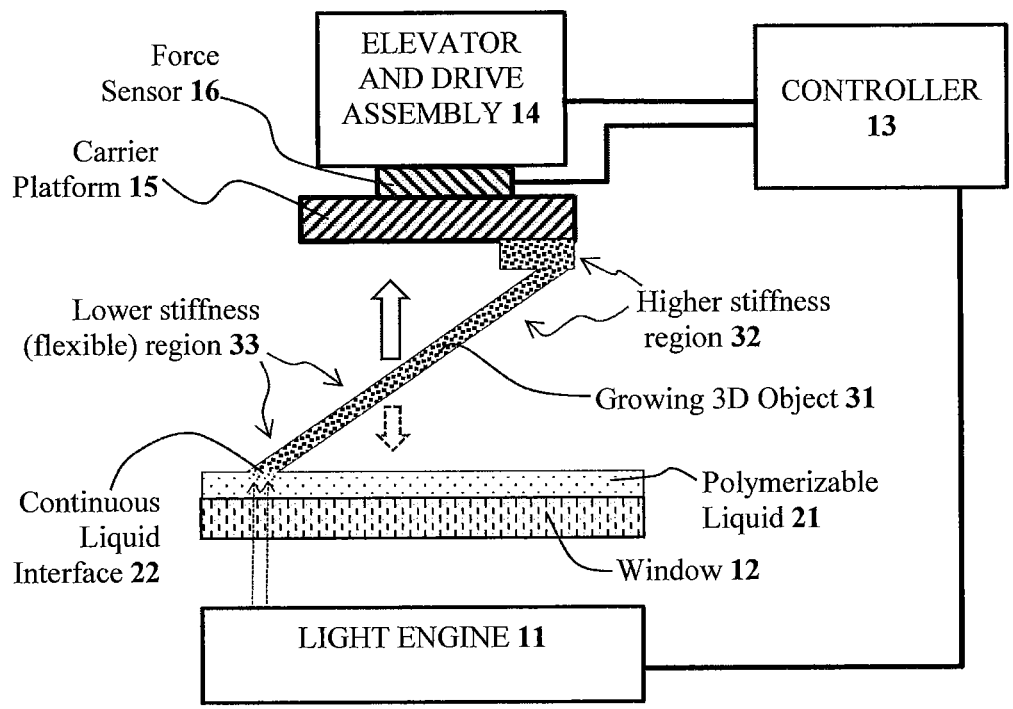
FIG. 1 schematically illustrates an apparatus useful for carrying out the present invention. The larger upward arrow indicates the dominant direction of upward movement during both stepped and reciprocal (or "pumped") modes of production. The dashed arrow indicates the lesser downward movement during reciprocal mode.

The present invention is now described more fully hereinafter with reference to the accompanying drawings, in which embodiments of the invention are shown. This invention may, however, be embodied in many different forms and should not be construed as limited to the embodiments set forth herein; rather these embodiments are provided so that this disclosure will be thorough and complete and will fully convey the scope of the invention to those skilled in the art.

Like numbers refer to like elements throughout. In the figures, the thickness of certain lines, layers, components, elements or features may be exaggerated for clarity. Where used, broken lines illustrate optional features or operations unless specified otherwise.

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises" or "comprising," when used in this specification, specify the presence of stated features, integers, steps, operations, elements components and/or groups or combinations thereof, but do not preclude the presence or addition of one or more other features, integers, steps, operations, elements, components and/or groups or combinations thereof.

As used herein, the term "and/or" includes any and all possible combinations or one or more of the associated listed items, as well as the lack of combinations when interpreted in the alternative ("or").

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and claims and should not be interpreted in an idealized or overly formal sense unless expressly so defined herein. Well-known functions or constructions may not be described in detail for brevity and/or clarity.

It will be understood that when an element is referred to as being "on," "attached" to, "connected" to, "coupled" with, "contacting," etc., another element, it can be directly on, attached to, connected to, coupled with and/or contacting the other element or intervening elements can also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" another feature can have portions that overlap or underlie the adjacent feature.

Spatially relative terms, such as "under," "below," "lower," "over," "upper" and the like, may be used herein for ease of description to describe an element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus the exemplary term "under" can encompass both an orientation of over and under. The device may otherwise be oriented (rotated 90 degrees or at other orientations) and the spatially relative descriptors used herein interpreted accordingly. Similarly, the terms "upwardly," "downwardly," "vertical," "horizontal" and the like are used herein for the purpose of explanation only, unless specifically indicated otherwise.

It will be understood that, although the terms first, second, etc., may be used herein to describe various elements, components, regions, layers and/or sections, these elements, components, regions, layers and/or sections should not be limited by these terms. Rather, these terms are only used to distinguish one element, component, region, layer and/or section, from another element, component, region, layer and/or section. Thus, a first element, component, region, layer or section discussed herein could be termed a second element, component, region, layer or section without departing from the teachings of the present invention. The sequence of operations (or steps) is not limited to the order presented in the claims or figures unless specifically indicated otherwise.

1. General Methods and Apparatus.

As noted above, methods, apparatus, and polymerizable liquids or resins for "continuous liquid interface production" (or "CLIP") are known and described in, for example, J. DeSimone et al., PCT Applications Nos. PCT/US2014/015486 (published as U.S. Pat. No. 9,211,678); PCT/US2014/015506 (published as U.S. Pat. No. 9,205,601), PCT/US2014/015497 (published as U.S. Pat. No. 9,216,546), J. Tumbleston, et al., *Continuous liquid interface production of 3D Objects, Science* 347, 1349-1352 (published online 16 Mar. 2015), and R. Janusziewcz et al., Layerless fabrication with continuous liquid interface production, *Proc. Natl. Acad. Sci. USA* 113, 11703-11708 (Oct. 18, 2016). Other approaches for carrying out continuous liquid interface production (or "CLIP") include utilizing a liquid interface comprising an immiscible liquid (see L. Robeson et al., WO 2015/164234, published Oct. 29, 2015), generating oxygen as an inhibitor by electrolysis (see I. Craven et al., WO 2016/133759, published Aug. 25, 2016), and incorporating magnetically positionable particles to which the photoactivator is coupled into the polymerizable liquid (see J. Rolland, WO 2016/145182, published Sep. 15, 2016). Still other approaches are described in US Patent Application Publication Nos. 2017/0129169 to Batchelder et al. and 2016/0288376 to Sun et al.

In addition, and as also noted above, methods and apparatus for implementing CLIP with step-wise or reciprocal advancement of the carrier, and growing three-dimensional object, away from the optically transparent member or "window" are known and described in, for example, A. Ermoshkin et al., *Three-Dimensional Printing with Reciprocal Feeding of Polymerizable Liquid*, PCT Application Publication No. WO 2015/195924.

Dual cure polymerizable liquids useful for CLIP are known and described in, for example, J. Rolland et al., PCT Applications PCT/US2015/036893 (see also US Patent Application Pub. No. US 2016/0136889), PCT/US2015/036902 (see also US Patent Application Pub. No. US 2016/0137838), PCT/US2015/036924 (see also US Patent Application Pub. No. US 2016/016077), and PCT/US2015/036946 (see also U.S. Pat. No. 9,453,142).

2. Implementation with Force Feedback.

As noted above, FIG. 1 schematically illustrates an apparatus useful for carrying out the present invention. The larger upward arrow indicates the dominant direction of upward movement during both stepped and reciprocal (or "pumped") modes of production. The dashed arrow indicates the lesser downward movement during reciprocal mode. In general, the apparatus includes a light engine 11, a window (or "build plate") 12, a controller 13, and elevator and drive assembly 14. A carrier platform (or "carrier plate") 15 is mounted to the elevator and drive assembly as in conventional apparatus, but with a force sensor 16 operatively associated therewith. A polymerizable liquid 21 is provided on top of the window 12.

The window 12 may be impermeable or semipermeable to an inhibitor of polymerization (e.g. oxygen), depending on which particular approach for carrying out continuous liquid interface production is employed. In some embodiments, the window comprises a fluoropolymer, in accordance with known techniques.

A growing three-dimensional object 31 is shown being formed between the carrier platform 15 (to which it is adhered) and the polymerizable liquid 21, with a continuous liquid interface 22 between the polymerizable liquid 21 and the object 31. Regions of higher stiffness (rigid regions) 32 and regions of lower stiffness (flexible regions) 33 on the growing object are indicated. As suggested by the schematic illustration, the flexible regions are those highly cantilevered and formed later in the process, but in other embodiments (e.g., highly meshed objects and/or objects formed by resins which are inherently flexible when solidified) the entire object may be flexible.

Any suitable light engine 11, including any of a variety of light sources and/or patterning elements, may be used, including lasers (e.g., scanning lasers as in traditional stereolithography), liquid crystal display (LCD) panels, digital micromirror displays (DMDs), etc. A single light engine may be used, or a tiled set of light engines may be used, depending on the size of the window 12 and the desired resolution.

While the schematic suggests that advancing away is accomplished by lifting the carrier on the elevator, note also that advancing away and partially retracting may be achieved by providing fixed or static carrier, and by mounting the window and light engine on an elevator beneath the same, which can then be lowered.

Any suitable device may be used as force sensor 16. Examples include, but are not limited to, mechanical tactile sensors, capacitive force sensors, metal strain gauges, semiconductor strain gauges, conductive elastomers, carbon felt and carbon fiber sensors, piezoelectric force sensors, pyroelectric force sensors, optical force sensors, magnetic force sensors, ulotrasonic force sensors, electrochemical force sensors, etc., including combinations thereof. See, e.g., Matthias Fassler, *Force Sensing Technologies* (Swiss Federal Institute of Technology Zurich, Spring Term 2010). One suitable example is the Omega LCM202-1KN Miniature Metric Universal Load Cell, available from Omega Engineering, Inc. (800 Connecticut Ave., Suite 5N01, Norwalk, Conn. 06854 USA). Any suitable configuration of the force sensor or load cell may be used, including but not limited to a single load cell mounted (or "sandwiched") in-line between the carrier and the elevator. The force sensor may include multiple force sensors providing an averaged output (e.g., sandwiched between a compression plate to equalize load), and/or may include multiple force sensors providing independent data from multiple regions of the carrier. In addition, force sensing can be carried out by sensing motor current or torque, or any other direct or indirect measure of force.

Further details of structuring a non-limiting example of an apparatus of the invention to carry out the methods described herein are given in FIGS. 2-7. In this illustrative embodiment, communication between the microcontroller and a master system controller (which may be local or remote, e.g., cloud-based) is not not shown. Whenever a move, wait, or expose function is called, in the illustrative embodiment they are instructed by a higher level master system controller and executed by the microcontroller. Of course, the entire control protocols could alternatively be implemented by the master system controller, or by a local controller.

Figure 2:
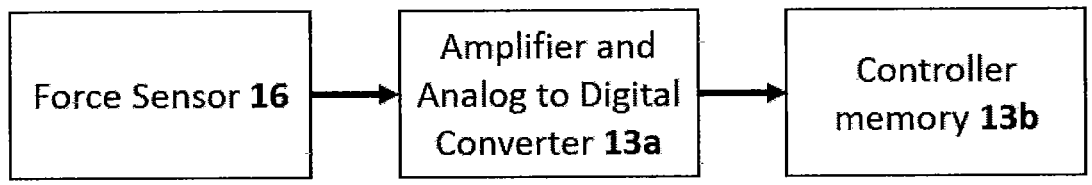
FIG. 2 schematically illustrates force sensor and control components of one embodiment of an apparatus of the invention.

As generally illustrated in FIG. 2, the force sensor 16, which is an analog device, is sampled digitally by the microcontroller with an Analog-to-Digital Converter (ADC; 13*a*) and the information stored in the micro controller memory 13*b*. The micro controller preferably maintains a constant sampling rate with the ADC and analog device. The micro controller handles all moving, waiting, and light engine functions. Without force feedback (as may be used in combination with force feedback in the present invention), a pre-calculated list of commands is given to the micro controller from a higher level system controller. With force feedback, the micro controller can be instructed to move_and_wait_with_feedback instead of using a fixed pre-calculated wait command. Any logic language can be used to code the micro controller, including but not limited to C/C++.

Figure 3:
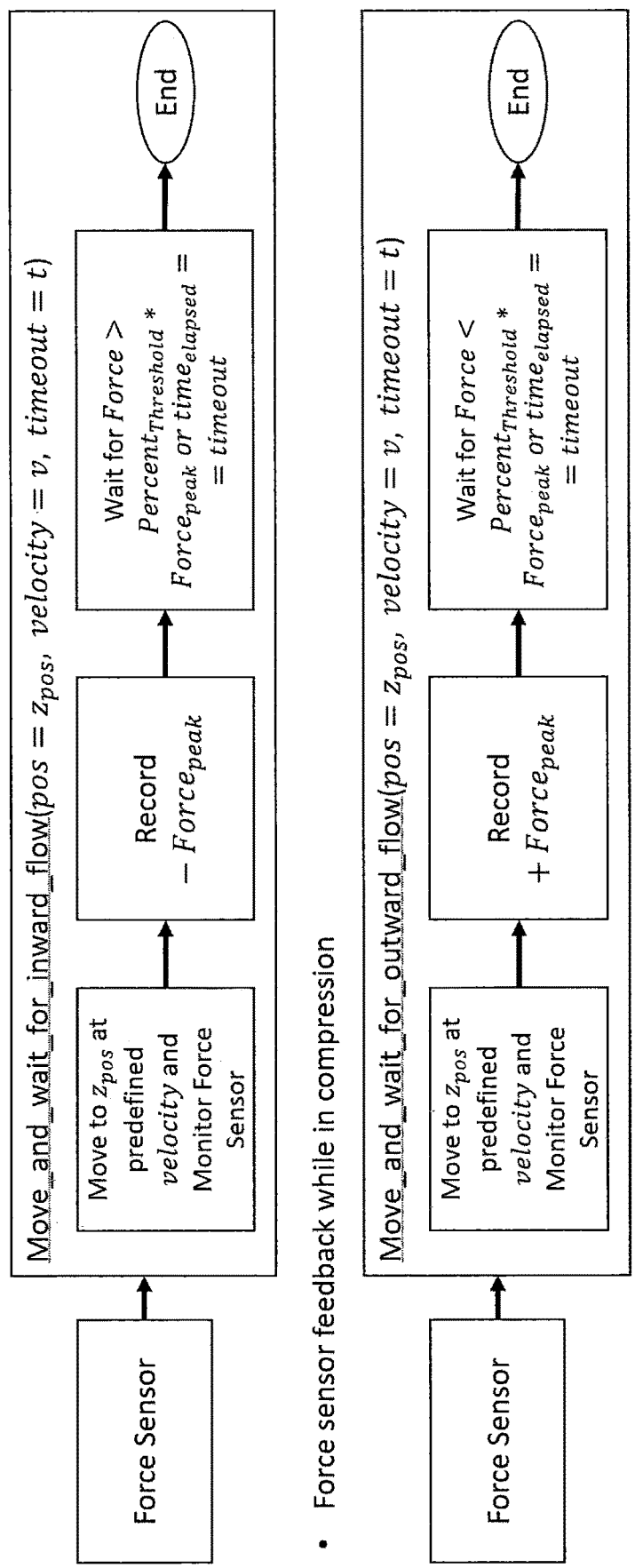
FIG. 3 schematically illustrates components (or operations) implemented in (or by) the controller (microcontroller) of one embodiment of an apparatus of the present invention.

FIG. 3 illustrates further components (or operations) implemented in (or by) the micro-controller. The higher level system controller advises the micro controller to move, wait, and monitor the force sensor for triggers. Negative forces are described in the figures as "Tension;" Positive forces are described in the figures as "Compression."

FIG. 4 illustrates stepped control elements of one embodiment of an apparatus of the invention, but without force feedback implemented, and FIG. 5 illustrates stepped control elements of the embodiment of FIG. 4, but with force feedback now implemented. As noted previously, all cycles in the production of an object may utilize force feedback, or some cycles may forgo force feedback (e.g., for production of an early segment of the object, or for production of a portion with a highly predictable behavior). In similar fashion, FIG. 6 illustrates reciprocal control elements of one embodiment of an apparatus of the invention, but without force feedback implemented, and FIG. 7 illustrates reciprocal control elements of the embodiment of FIG. 6, but with force feedback now implemented. Some or all of the foregoing modes of operation may be combined together during the production of a particular object, and indeed some portions of the object may indeed be fabricated in a "continuous" mode of operation.

In general, methods of the present invention may be carried out as follows, where the presence or absence of optional steps depends on (i) whether the force feedback is implemented during step-wise, or reciprocal, carrier advancing, and (ii) whether the force feedback is implemented during the upstroke, the downstroke, or both the upstroke and downstroke of a particular cycle. With this in mind, the steps of various embodiments may generally include:

(a) First, providing a carrier and an optically transparent member having a build surface, the carrier and the build surface defining a build region therebetween, the optically transparent member carrying a polymerizable liquid.

(b) With the foregoing provided, the method commences by advancing the carrier and the optically transparent member away from one another to draw polymerizable liquid into the build region. The distance of advance is not critical, but in general, taken together with the following partially advancing step, the cumulative distance of advance (sometimes also referred to as the "slice thickness") may be from of 0.1 or 0.2 millimeters, up to 20 or 40 millimeters, or more. The next step may immediately follow, or there may be a short pause (e.g., of from 0.1 or 1 second to 5, 10, 100 or 300 seconds or more, such as a "plateu" between advancing and partially retracting in reciprocal mode, or simply a pause between advancing and irradiating in step mode).

(c) Optionally, but in some embodiments preferably, following the aforesaid advancing step, the carrier and the optically transparent member are partially retracted back towards one another (immediately following the advancing step (no delay) or after a pause as described above).

(d) Following the the advancing step (b) and optional retracting step (c), the build region is irradiated with light to form a growing three-dimensional object from the polymerizable liquid. Irradiation may be for any suitable duration, such as a time of 0.1 or 0.5 seconds, to 10, 20, 50 or 100 seconds, or more). The next step (a cyclic return to step (b) may immediately follow, or may follow after a pause, as discussed below).

(e) Following the irradiating step (d) (e.g., immediately following (no delay), or after a delay of 0.1 seconds to 1, 10 or 100 seconds), steps (b) to (d) are cyclically repeated (e.g., from 5 or 10 additional times, to 5,000 or 10,000 additional times or more), while maintaining a continuous liquid interface between the growing three-dimensional object and the optically transparent member, until at least a portion of the three-dimensional object is formed.

During at least some of the aforesaid cyclical repeatings, there is further preformed the steps of:

(i) optionally, but in some embodiments preferably, monitoring a transient increase in tension between the carrier and the build surface through the growing three-dimensional object during the advancing step (b), and optionally monitoring a transient increase in compression between the carrier and the build surface through the growing three dimensional object during the partially retracting step (c); and then, when the transient increase in tension has substantially subsided, (ii) optionally, but in some embodiments preferably, initiating the partially retracting step (c) when present, or initiating the irradiating step (d); then (iii) monitoring a transient increase in compression between the carrier and the build surface through the growing three dimensional object during the partially retracting step (c); and then, when the transient increase in compression has substantially subsided, (iv) initiating the irradiating step (d).

Times and distances given above are not critical, and are for illustrative purposes only. Specific times and distances will depend upon factors such as object geometry, irradiation wavelength and intensity, object resolution requirements, resin properties (including but not limited to photoinitiator type and density, resin viscosity and polymerized resin properties following irradiation), operating temperature, etc., and can be optimized by those skilled in the art. "Substantially subsided" when referring to transient increases (or decreases) in tension (or compression) generally means within five, ten, or twenty percent of the immediately prior tension or compression. In general, the overall or average speed of fabricating the object, or relevant portion thereof, is at least 1 or 10 millimeters per hour, up to 1,000 or 10,000 millimeters per hour, or more.

FIG. 8 illustrates a stepped mode of operation of continuous liquid interface production (CLIP), with force monitoring, but without feedback FIG. 9 illustrates substantially the same mode of operation, but this time with force feedback utilized to initiate the next exposure or irriadiation step during the cyclical repeating of steps. The upward arrow indicates the approximate time and direction of movement of the carrier during the advancing step. Note the reduction in time to complete three cycles in FIG. 9 as compared to FIG. 8.

FIG. 10 illustrates a reciprocal mode of operation of CLIP, with force monitoring, but without feedback. FIG. 11 illustrates the reciprocal mode of operation of CLIP of FIG. 10, but with force feedback implemented (for both tension and compression) to initiate, first, the partially retracting step following each advancing step, and second, the irradiating step following each partially retractacting step. The larger upward arrow indicates the approximate time and dominant upward direction of movement of the carrier during the advancing step, and the downward arrow indicates the approximate time and lesser downward movement of the carrier during the partial retracting step. Note the reduction in time to complete three cycles in FIG. 11 as compared to FIG. 10.

In some embodiments, a benefit of force sensor feedback is that it enables more efficient printing of elastic objects. For example, the stiffness or elasticity of the object being made, or portions thereof, need not be known. The object merely needs to be sufficiently stiff to (a) withstand the force of production without ripping or fracturing the part, and (b) overcome fluid forces of the resin to reach the desired slice height for each exposure or irradiation. Without feedback as described herein, a solution may be a complicated and difficult to validate finite element analysis (FEA) model that simulates stiffness, deformation, and adhesion forces, and the actual distance or height required to advance the carrier to overcome adhesion forces (i.e., to "pump" resin into the build zone). The result of such an approach would typically be conservative, because such simulations are hard to perfect, particularly when process input data is not consistent. In contrast, the methods described herein allow for a more aggressive approach to reducing the amount of time otherwise wasted during each exposure cycle.

Figure 12:
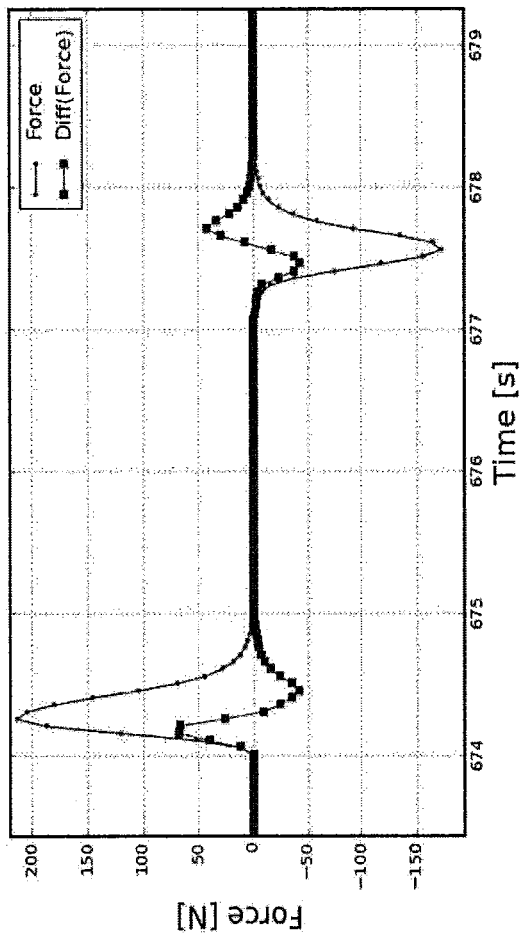
FIG. 12 graphically compares measure of absolute force (light line with circles) with a measure of rate of change of force (heavy line with squares).
Figure 13:
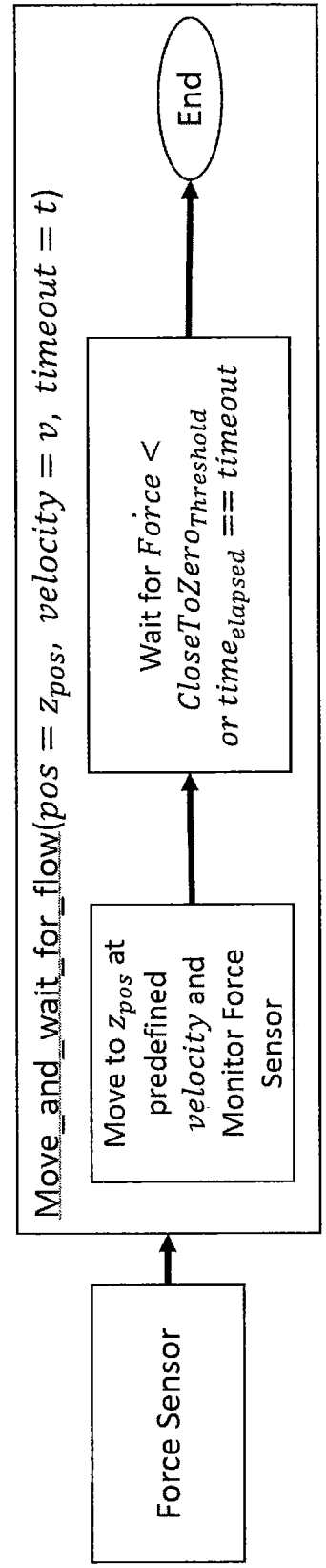
FIG. 13 is similar to FIG. 3, but with force rate of change as the force measurement.
Figure 14:
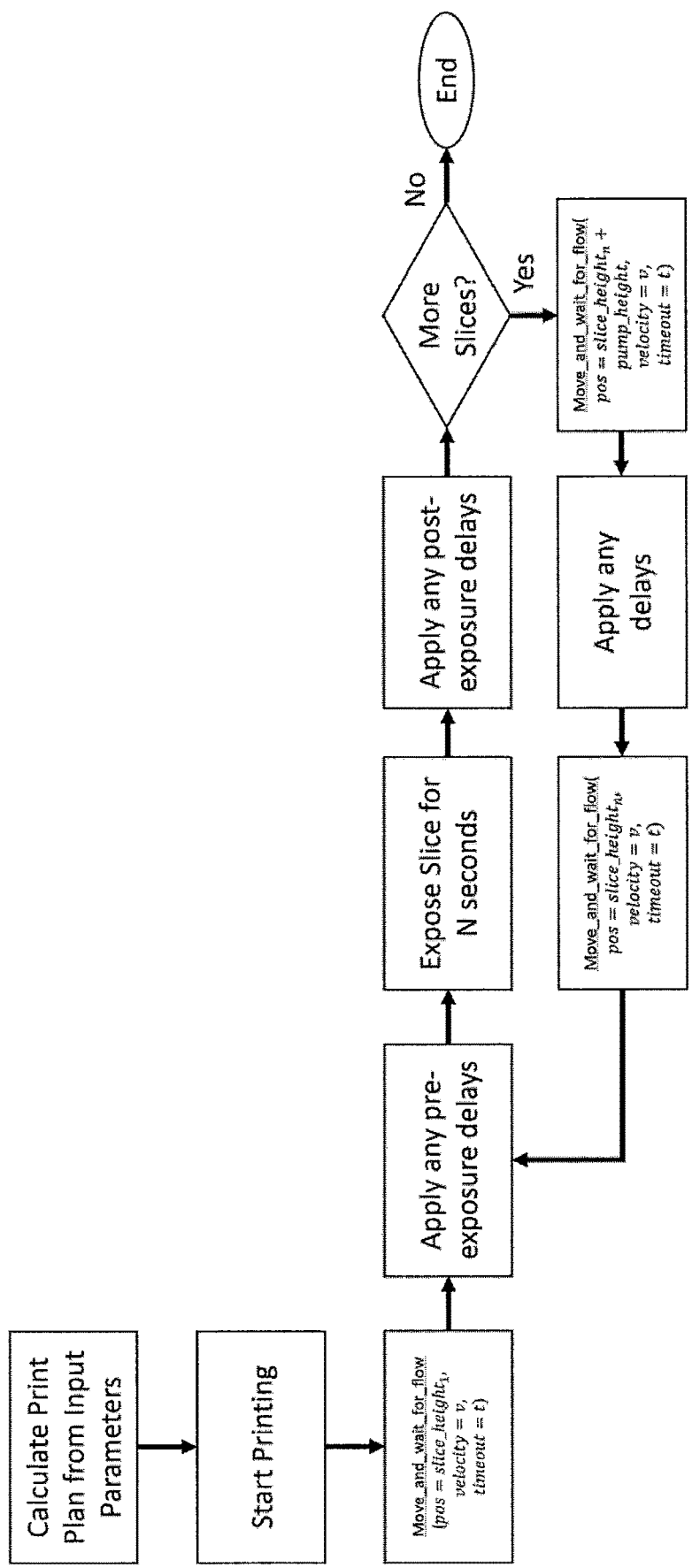
FIG. 14 is similar to FIG. 7, but with force rate of change as the force measurement.

In some embodiments, when absolute force is measured, there can be a slow drift of zero (lack of tension or compression) over time. Without wishing to be bound to any particular theory, this can result from, for example, the addition of weight to the carrier platform as additional resin is polymerized thereto, buoyancy force changes as the part builds in the Z vertical) direction, electronic sensor nonlinearities, etc. While drift of zero can be tracked by a variety of techniques, a solution is to utilize force rate of change (equivalent to slope, see FIG. 12) to track force, as shown in FIGS. 13-14. Again, functions can be implemented in a microcontroller, with a higher level system controller advising the microcontroller to move, wait, monitor the force sensor for triggers, and the like.

Implementing force sensing based on rate of change provides a working feedback solution. However, this technique loses some fault tolerant aspects of monitoring absolute force. Hence, a still more robust technique is to use both absolute force, and rate of change of force, in combination, as the force sensing technique.

The foregoing is illustrative of the present invention, and is not to be construed as limiting thereof. The invention is defined by the following claims, with equivalents of the claims to be included therein.

I claim:
1. A method of making a three-dimensional object, comprising the steps of:
 (a) providing a carrier and an optically transparent member having a build surface, said carrier and said build surface defining a build region therebetween, said optically transparent member carrying a polymerizable liquid;
 (b) advancing said carrier and said optically transparent member away from one another to draw said polymerizable liquid into said build region; then
 (c) optionally, partially retracting said carrier and said optically transparent member back towards one another; and then
 (d) irradiating said build region with light to form a growing three-dimensional object from said polymerizable liquid; and then
 (e) cyclically repeating steps (b) to (d) while maintaining a continuous liquid interface between said growing three-dimensional object and said optically transparent member until at least a portion of said three-dimensional object is formed, while during at least some of said cyclically repeatings:
  (i) monitoring a transient increase in tension between said carrier and said build surface through said growing three-dimensional object during said advancing step (b), and optionally monitoring a transient increase in compression between said carrier and said build surface through said growing three dimensional object during said partially retracting step (c); and then, when said transient increase in tension has substantially subsided,
  (ii) initiating said partially retracting step (c) when present, or initiating said irradiating step (d).

2. The method of claim 1, wherein said step of monitoring a transient increase in tension is carried out by: (a) monitoring absolute force, (b) monitoring rate of change of force, or (c) monitoring both absolute force and rate of change of force in combination with one another.

3. The method of claim 1, wherein said step of monitoring a transient increase in tension is carried out by monitoring both absolute force and rate of change of force in combination with one another.

4. The method of claim 1, wherein during at least some of said cyclically repeatings, said partially retracting step (c) is absent.

5. The method of claim 1, wherein during at least some of said cyclically repeatings, said partially retracting step (c) is present.

6. The method of claim 5, further comprising, during at least some of said cyclically repeatings:
 (iii) monitoring a transient increase in compression between said carrier and said build surface through said growing three dimensional object during said partially retracting step (c); and then, when said transient increase in compression has substantially subsided,
 (iv) initiating said irradiating step (d).

7. The method of claim 1, wherein at least a portion of said three-dimensional object is formed while (f) continuously advancing said carrier and said optically transparent member away from one another and (g) intermittently or continuously irradiating said build region to form said growing three-dimensional object, while maintaining said continuous liquid interface.

8. The method of claim 1, wherein at least a portion of said growing three-dimensional object is flexible due to flexibility of the solidified material, the geometry of the object, or a combination thereof.

9. The method of claim 1, wherein at least a portion of said three-dimensional object and/or growing three-dimensional object is in the form of a lattice or mesh.

10. The method of claim 1, wherein said polymerizable liquid is viscous at ambient or room temperature.

11. The method of claim 1, wherein:
said optically transparent member comprises a semipermeable member, the advancing, partially retracting when present, irradiating, and/or cyclically repeating steps are carried out while also concurrently:
 (i) continuously maintaining a dead zone of polymerizable liquid in contact with the build surface, and/or
 (ii) continuously maintaining a gradient of polymerization zone between the dead zone and the growing three-dimensional object and in contact with each thereof, the gradient of polymerization zone comprising the polymerizable liquid in partially cured form, and said continuously maintaining a dead zone is carried out by feeding an inhibitor of polymerization through said optically transparent member, thereby creating a gradient of inhibitor in said dead zone and optionally in at least a portion of said gradient of polymerization zone.

12. The method of claim 11, wherein:
said polymerizable component comprises a free radical polymerizable liquid and said inhibitor comprises oxygen; or
said polymerizable component comprises an acid-catalyzed or cationically polymerizable liquid, and said inhibitor comprises a base.

13. The method of claim 1, wherein said three-dimensional object is fabricated at a speed of at least 1 or 10 millimeters per hour, to 1,000 or 10,000 millimeters per hour, or more.

14. A method of making a three-dimensional object, comprising the steps of:
(a) providing a carrier and an optically transparent member having a build surface, said carrier and said build surface defining a build region therebetween, said optically transparent member carrying a polymerizable liquid;
(b) advancing said carrier and said optically transparent member away from one another to draw said polymerizable liquid into said build region; then
(c) partially retracting said carrier and said optically transparent member back towards one another; and then
(d) irradiating said build region with light to form a growing three-dimensional object from said polymerizable liquid; and then;
(e) cyclically repeating steps (b) to (d) while maintaining a continuous liquid interface between said growing three-dimensional object and said optically transparent member until at least a portion of said three-dimensional object is formed, while during at least some of said cyclically repeatings:
  (i) optionally, monitoring a transient increase in tension between said carrier and said build surface through said growing three-dimensional object during said advancing step (b), and optionally monitoring a transient increase in compression between said carrier and said build surface through said growing three dimensional object during said partially retracting step (c); and then, when said transient increase in tension has substantially subsided,
  (ii) optionally, initiating said partially retracting step (c) when present, or initiating said irradiating step (d); then
  (iii) monitoring a transient increase in compression between said carrier and said build surface through said growing three dimensional object during said partially retracting step (c); and then, when said transient increase in compression has substantially subsided,
  (iv) initiating said irradiating step (d).

15. The method of claim 14, wherein at least a portion of said three-dimensional object is formed while (f) continuously advancing said carrier and said optically transparent member away from one another and (g) intermittently or continuously irradiating said build region to form said growing three-dimensional object, while maintaining said continuous liquid interface.

16. The method of claim 14, wherein at least a portion of said growing three-dimensional object is flexible due to flexibility of the solidified material, the geometry of the object, or a combination thereof.

17. The method of claim 14, wherein at least a portion of said three-dimensional object and/or growing three-dimensional object is in the form of a lattice or mesh.

18. The method of claim 14, wherein said polymerizable liquid is viscous at ambient or room temperature.

19. The method of claim 14, wherein:
said optically transparent member comprises a semipermeable member, the advancing, partially retracting, irradiating, and/or cyclically repeating steps are carried out while also concurrently:
  (i) continuously maintaining a dead zone of polymerizable liquid in contact with the build surface, and/or
  (ii) continuously maintaining a gradient of polymerization zone between the dead zone and the growing three-dimensional object and in contact with each thereof, the gradient of polymerization zone comprising the polymerizable liquid in partially cured form,
and said continuously maintaining a dead zone is carried out by feeding an inhibitor of polymerization through said optically transparent member, thereby creating a gradient of inhibitor in said dead zone and optionally in at least a portion of said gradient of polymerization zone.

20. The method of claim 19, wherein:
said polymerizable component comprises a free radical polymerizable liquid and said inhibitor comprises oxygen; or
said polymerizable component comprises an acid-catalyzed or cationically polymerizable liquid, and said inhibitor comprises a base.

21. The method of claim 14, wherein said three-dimensional object is fabricated at a speed of at least 1 or 10 millimeters per hour, to 1,000 or 10,000 millimeters per hour, or more.

22. An apparatus useful for making a three-dimensional object from a polymerizable liquid, comprising:
(a) a carrier on which a three-dimensional object can be made;
(b) an optically transparent member having a build surface operatively associated with said carrier, said carrier and said build surface defining a build region therebetween, said optically transparent member configured for carrying a polymerizable liquid;
(c) an elevator assembly operatively associated with said carrier and/or said optically transparent member, said elevator assembly configured for advancing said carrier and said optically transparent member away from one another to draw said polymerizable liquid into said build region; then
(d) a light engine operatively associated with said optically transparent member and positioned to irradiate said build region with light to form a growing three-dimensional object from said polymerizable liquid;
(e) a force sensor operatively associated with said carrier and/or said optically transparent member and configured to monitor a transient increase in tension and/or a transient increase in compression between said carrier and said build surface through a three-dimensional object being formed therebetween; and
(f) a controller operatively associated with said elevator assembly, said light engine, and said force sensor, with said controller configured for cyclically repeating cycles of advancing said carrier and said build surface away from one another, then optionally partially retracting said carrier and build surface back towards one another, and then irradiating said build region with light, to form a three-dimensional object therebetween while maintaining a continuous liquid interface between said three-dimensional object and said optically transparent member until at least a portion of said three-dimensional object is formed, said controller further configured to, during at least some of said cyclically repeatings:

(i) monitor a transient increase in tension between said carrier and said build surface through said growing three-dimensional object during said advancing, optionally monitor a transient increase in compression between said carrier and said build surface through said growing three dimensional object during said partially retracting, and then, when said transient increase in tension has substantially subsided, initiate said partially retracting when present, or initiating said irradiating; and/or (ii) monitor a transient increase in compression between said carrier and said build surface through said growing three dimensional object during said partially retracting, and then, when said transient increase in compression has substantially subsided, initiate said irradiating.

23. The apparatus of claim 22, wherein said optically transparent member comprises a semipermeable member.

24. The apparatus of claim 22, wherein said light engine comprises a light source in combination with a patterning array.

25. The apparatus of claim 22, wherein said force sensor comprises a strain gauge.

* * * * *

UNITED STATES PATENT AND TRADEMARK OFFICE
CERTIFICATE OF CORRECTION

PATENT NO. : 10,933,580 B2  
APPLICATION NO. : 16/466517  
DATED : March 2, 2021  
INVENTOR(S) : Ronald A. Truong Page 1 of 1

It is certified that error appears in the above-identified patent and that said Letters Patent is hereby corrected as shown below:

In the Specification

Column 1, Line 11:
Please correct "the disclosure disclosures of which" to read -- the disclosures of which --

Column 1, Line 12:
Please correct "in its entirety their entireties" to read -- in their entireties --

Signed and Sealed this
First Day of June, 2021

Drew Hirshfeld
*Performing the Functions and Duties of the*
*Under Secretary of Commerce for Intellectual Property and*
*Director of the United States Patent and Trademark Office*